United States Patent [19]
Roohparvar

[11] Patent Number: 6,088,266
[45] Date of Patent: *Jul. 11, 2000

[54] METHOD AND APPARATUS FOR PULSE PROGRAMMING

[75] Inventor: Frankie Fariborz Roohparvar, Santa Clara, Calif.

[73] Assignee: Micron Technology, Inc., Boise, Id.

[ * ] Notice: This patent is subject to a terminal disclaimer.

[21] Appl. No.: 09/332,488

[22] Filed: Jun. 14, 1999

Related U.S. Application Data

[63] Continuation of application No. 08/980,529, Dec. 1, 1997.

[51] Int. Cl.⁷ .................................................. G11C 16/04
[52] U.S. Cl. ................... 365/185.19; 365/185.33
[58] Field of Search ................... 365/185.18, 185.19, 365/185.23, 185.28, 185.33

[56] References Cited

U.S. PATENT DOCUMENTS

| | | | |
|---|---|---|---|
| 5,598,369 | 1/1997 | Chen et al. | 365/185.27 |
| 5,608,679 | 3/1997 | Mi et al. | 365/201 |
| 5,617,357 | 4/1997 | Haddad et al. | 365/185.27 |
| 5,636,166 | 6/1997 | Roohparvar | 365/194 |
| 5,751,637 | 5/1998 | Chen et al. | 365/185.33 |
| 5,812,458 | 9/1998 | Gotou | 365/185.23 |

*Primary Examiner*—David Nelms
*Assistant Examiner*—Gene Auduong
*Attorney, Agent, or Firm*—Schwegman, Lundberg, Woessner & Kluth, P.A.

[57] ABSTRACT

A method of the present invention includes the step of applying a drain pulse to a drain of a flash cell. A gate pulse is applied to a control gate of the flash cell coincident with the drain pulse. The amplitude of the gate pulse is varied between a maximum and a diminished amplitude to form a series of modulated gate pulses. The modulated gate pulses have substantially similar maximum and diminished amplitudes. A width of a modulated gate pulse is substantially lower than a width of the drain pulse. An apparatus of the present invention includes a flash cell having a control gate, a floating gate, a drain, and a channel. A switchable charge pump is coupled to the control gate, and generates a modulated gate pulse. A power supply is coupled to the drain and generates a drain pulse. The modulated gate pulse is coupled to the control gate coincidently when the drain pulse is coupled to the drain. The width of the modulated gate pulse is substantially lower than the width of the drain pulse.

51 Claims, 2 Drawing Sheets

METHOD AND APPARATUS FOR PULSE PROGRAMMING

This application is a continuation of U.S. Ser. No. 08/980,529 filed Dec. 1, 1997.

FIELD OF THE INVENTION

The present invention generally relates to electrical technology and, more specifically, to a method and apparatus for pulse programming.

BACKGROUND OF THE INVENTION

Flash memories include arrays of flash cells that are electrically programmed using relatively high drain and gate bias voltages. However, designers of electrical systems that incorporate flash memories prefer not to include high voltage supplies in the electrical systems in order to diminish electrical system cost and power consumption. As a result, flash memories are designed for use with low voltage supplies having voltages, for example, as low as three volts. Thus, the flash memories are also designed to include charge pumps to create the required higher supply voltages.

Conventionally, a flash cell is programmed by charging the floating gates of flash cells. The charge is drawn from the flash cells' channels into the floating gates by coincidentally applying relatively high drain- and gate-to-source voltage pulses to the flash cells. For example, the drain- and gate-to-source voltage pulses have maximum amplitudes of respectively five and eleven volts, and minimum amplitudes of zero volts. These gate- and drain-to-source voltage pulses respectively have pulse widths of thirty microseconds and ten microseconds.

When the amplitude of the drain-to-source voltage pulse is minimum, the flash cell operates in its cut-off region. When the amplitude of the drain-to-source voltage pulse is maximum, the flash cell operates in its linear region because the threshold of an erased or unprogrammed flash cell is typically about three volts. During the transition of the drain-to-source voltage pulse between minimum and maximum amplitudes, the flash cell operates briefly in its saturated region.

In both the saturated and linear regions, modem flash cells generate hot electrons, in the channel current, that travel at a saturated or maximum velocity, and thus have high energy. Hot electrons arise in the channels of modem flash cells because the drain-to-source voltages are sufficiently high, and the flash cells' gate lengths are sufficiently small.

Hot electrons in the channel current form the programming current used to program the flash cell. The programming current is the flow of hot electrons from a flash cell channel into its floating gate. Hot electrons can only surmount the energy barrier separating the floating gate and the channel when the energy barrier is reduced by a sufficiently high gate-to-source voltage, such as when the flash cell operates in the linear region.

With conventional programming, the programming current is relatively small in comparison to the channel current. Thus, conventional programming is very inefficient. For example, conventional charge pumps can simultaneously program only relatively few flash cells. For example, one typical 16-bit programming operation is performed 4 bits, rather than 16 bits, at a time. This segmented programming operation significantly increases the programming time of flash memories. Therefore, there is a need to reduce the programming time of flash memories.

SUMMARY

The present invention solves the above-mentioned problems in the art and other problems which will be understood by those skilled in the art upon reading and understanding the present specification. The present invention provides a method and apparatus for pulse programming.

A method of the present invention includes the step of applying a drain pulse to a drain of a flash cell. A gate pulse is applied to a control gate of the flash cell coincident with the drain pulse. The amplitude of the gate pulse is varied between a maximum and a diminished amplitude to form a series of modulated gate pulses. The modulated gate pulses have substantially similar maximum and diminished amplitudes. A width of a modulated gate pulse is substantially lower than a width of the drain pulse.

In one embodiment, the step of applying a drain pulse further comprises the step of varying the drain pulse between maximum and minimum amplitudes of respectively five and one half, and zero volts. In yet another embodiment, the step of varying comprises the step of varying the gate pulse between maximum and diminished amplitudes so that the flash cell respectively operates in linear and saturated regions.

An apparatus of the present invention includes a flash cell having a control gate, a floating gate, a drain, a source, and a channel. A switchable charge pump is coupled to the control gate, and generates a modulated gate pulse. A power supply is coupled to the drain and generates a drain pulse. The modulated gate pulse is coupled to the control gate coincidently when the drain pulse is coupled to the drain. The width of the modulated gate pulse is substantially lower than the width of the drain pulse.

In one embodiment, the modulated gate pulse further comprises a maximum and a diminished amplitude. Hot electrons are substantially created in the channel during the diminished amplitude. The hot electrons are substantially drawn into the floating gate during the maximum amplitude. In yet another embodiment, a charge pump is coupled to the drain.

In yet another embodiment, the apparatus includes a memory array, including a flash cell, coupled to control and address logic. In a further embodiment, the apparatus includes a processor coupled to a memory.

It is an advantage of the present invention that it reduces programming time of flash memories. It is also an advantage of the present invention that it reduces flash cell current.

DETAILED DESCRIPTION OF THE EMBODIMENTS

In the following detailed description of the preferred embodiments, reference is made to the accompanying drawings which form a part hereof and in which are shown by way of illustration specific preferred embodiments in which the invention may be practiced. The embodiments are described in sufficient detail to enable persons skilled in the art to practice the invention and it is to be understood that other embodiments may be utilized and that logical, mechanical and electrical changes may be made without departing from the scope of the present invention. The following detailed description is, therefore, not to be taken in a limiting sense.

Figure 1:
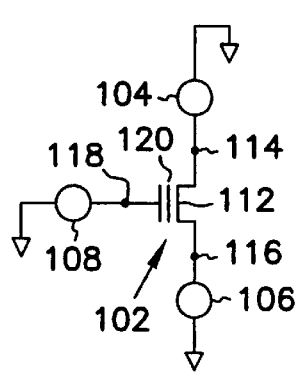
FIG. 1 illustrates one embodiment of a flash cell.
Figure 2A:
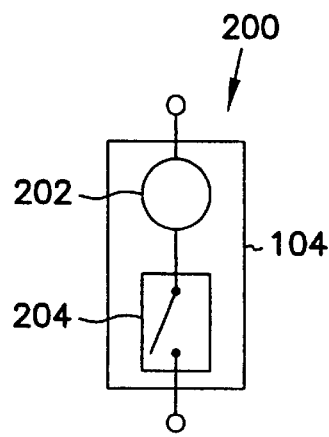
FIG. 2A illustrates one embodiment of a switchable charge pump.
Figure 2B:
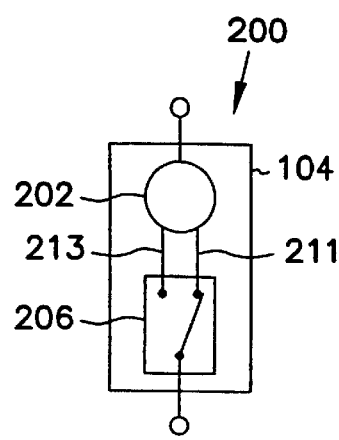
FIG. 2B illustrates another embodiment of a switchable charge pump.

FIG. 1 illustrates one embodiment of the present invention that comprises a flash cell 102 having a drain 114, a source 116, a control gate 118, and a floating gate 120. The flash cell 102 has a channel 112 between the drain 114 and source 116. The drain 114 is coupled to drain supply 104, the source 116 is coupled to a source supply 106, and the control gate 118 is coupled to a gate supply 108. The gate supply 108 comprises a switchable charge pump 200. In one embodiment, the drain supply 104 also comprises a charge pump 202. FIG. 2A illustrates one embodiment of a switchable charge pump 200 formed by a charge pump 202 serially coupled to a switch 204. FIG. 2B illustrates another embodiment of a switchable charge pump 200 formed by a charge pump 202 serially coupled to a second switch 206. The second switch 206 is coupled to two nodes 211, 213, of the charge pump 202, that respectively have relatively high and low voltages. In one embodiment, the relatively high and low voltages are respectively the maximum and diminished amplitudes of the gate-to-source voltage pulse described below.

A pulsed programming operation according to the present invention will now be described. Pulsed programming increases the time in which the flash cell 102 is operated in the saturated region. As a result, both the number of hot electrons in the channel current, and the programming current are both increased.

Pulse programming is performed by modulating the amplitude of the gate-to-source voltage pulse between diminished and maximum amplitudes. The diminished amplitude is lower than the maximum amplitude.

In one embodiment, during the transition between the diminished amplitude and the maximum amplitude, and at the diminished amplitude, the flash cell 102 is operated in the saturated region. The present invention recognizes that substantially more hot electrons are created in the saturated region than in the linear region. In one embodiment, substantially all of the hot electrons are created at the diminished amplitude. At the diminished amplitude, the gate-to-source voltage is so low that the hot electrons can not readily surmount the energy barrier, and thus are not transferred to the floating gate 120.

However, upon varying the amplitude, such as by switching, to the higher maximum amplitude, the flash cell 102 is operated in the linear region. Hence, the energy barrier is diminished by the higher maximum amplitude so that substantially all of the hot electrons have sufficient energy to overcome the energy barrier, and are drawn into the floating gate 120.

The amplitude is again varied, such as by switching, to the diminished amplitude. The foregoing process is repeated at a relatively high rate to generate many more hot electrons than by the conventional programming technique. In yet another embodiment, the varying step is performed by a gate supply 108 that comprises a switchable charge pump 200. As a result, the amount of hot electrons in the channel current is increased. Thus, the programming current is increased relative to the channel current. Hence, programming efficiency is enhanced and programming time is reduced.

Figure 3:
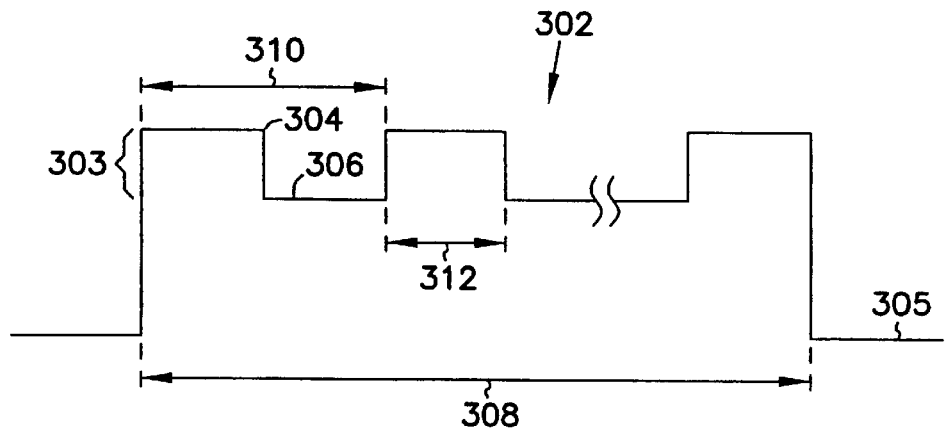
FIG. 3 illustrates one embodiment of a gate-to-source voltage pulse.

One embodiment of pulsed programming will now be described. The flash cell 102 is biased in manner similar to the conventional technique, except that the gate supply 108 is further modulated. The gate supply 108 is modulated to produce modulated gate-to-source voltage pulses 302 having a peak amplitude 303, a minimum amplitude 305, and a duty cycle 310, as illustrated in FIG. 3. In one embodiment, the minimum amplitude 305 is zero volts, and the duty cycle 310 is fifty percent. The peak amplitude 303 varies between a maximum amplitude 304 and a diminished amplitude 306. The modulated gate-to-source pulses 302 have substantially similar maximum and diminished amplitudes 304, 306. In one embodiment, the maximum amplitude 304 is approximately eleven volts and diminished amplitude 306 is approximately seven volts. In one embodiment, the width of the gate-to-source voltage pulse (GPW) 308 is approximately 30 microseconds, and the width of the modulated gate-to-source voltage pulses (MGPW) 312 is approximately 333 nanoseconds. In this embodiment, the gate-to-source voltage pulse 302 is modulated with a signal having a frequency of about 30 Megahertz.

Figure 4:
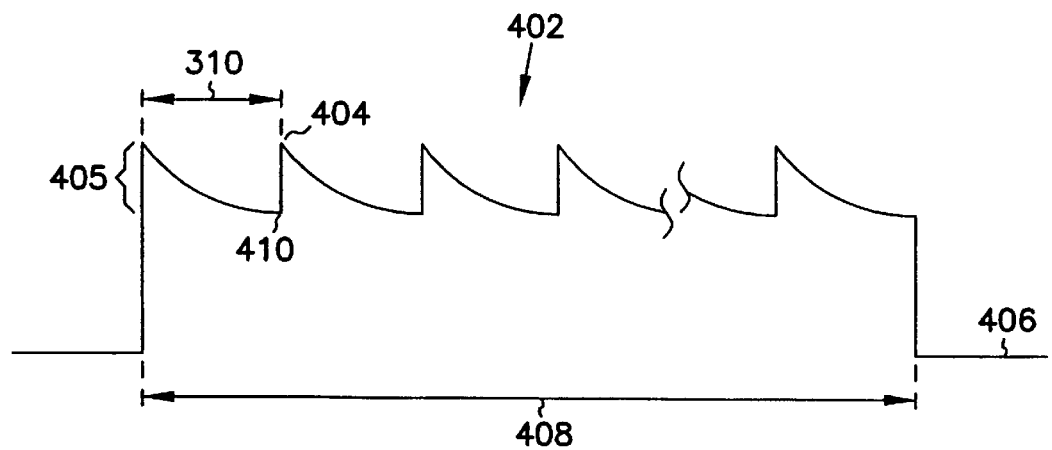
FIG. 4 illustrates one embodiment of a drain-to-source voltage pulse.

The gate-to-source voltage pulse 302 is coincidentally applied to the flash cell 102 with a drain-to-source voltage pulse 402, illustrated in FIG. 4. The MGPW 312 being at approximately 333 nanoseconds is substantially lower than the drain-to-source voltage pulse width (DPW) 408, which is approximately ten microseconds. As with conventional programming, the drain supply 104 produces a drain-to-source voltage pulse 402 having a peak amplitude 405 and a minimum amplitude 406.

When the gate-to-source voltage pulse 302 transitions from the maximum amplitude 304 to the diminished amplitude 306, the peak amplitude 405 decays from a maximum amplitude 404 to a diminished amplitude 410. In this embodiment, the maximum amplitude 404 is approximately five and one-half volts. The minimum amplitude 406 is approximately zero volts. The diminished amplitude 410 is approximately five volts.

Table 1 illustrates test data recorded while programming of a flash cell 102 with conventional and pulsed techniques using conventional power supplies rather than charge pumps 202. These measurements were obtained after the flash cell 102 was electrically erased.

TABLE 1

|  | $I_{max}$ 1001 | $I_{Avg}$ 1003 | Maximum Amplitude 304 | Maximum Amplitude 404 | GPW 308 | DPW 408 |
| --- | --- | --- | --- | --- | --- | --- |
| Conventional Programming | 790 µA | 480 µA | 11 V | 5 V | 30 µS | 10 µS |
| Pulsed Programming | 610 µA | 288 µA | 11 V | 5 V | 333 nS | 10 µS |

Table 1 illustrates the enhanced efficiency of pulsed programming arising because the channel current contains a higher amount of hot electrons. Thus, the average current 1003 required to program a flash cell 102 is lower by approximately forty percent, and the maximum current 1001 is lower by approximately 23 percent for pulsed programming than for conventional programming.

Hence, power supplies can simultaneously program more flash cells 102 with pulsed programming than with conventional programming. Therefore, pulsed programming can be used to program a flash memory more rapidly than the conventional technique.

Furthermore, it is envisioned that this effect will be more significant when the drain supply 104 is a charge pump 202, rather than a conventional power supply. Then, the average current 1003 will be further reduced in comparison to the use of a conventional programming. This effect arises because charge pumps 202 can only supply finite current or charge. With conventional programming, the relatively higher average current 1003 depletes the finite charge stored by the flash cell's drain-to-source capacitance, and provided by the charge pump 202. As a result, the maximum amplitude 404 of the drain-to-source voltage pulse is reduced.

However, when using pulse programming, the average current 1003, and thus the charge depletion, are reduced. Therefore, when the drain supply 104 is a charge pump 202, the maximum amplitude 404 is higher for pulse programming than for conventional programming. Hence, the flash cell 102 will operate in its saturated region for a relatively longer period of time. Thus, the amount of hot electrons in the channel current and the amount of programming current are both more significantly increased. Therefore, the programming time is more significantly reduced.

Figure 5:
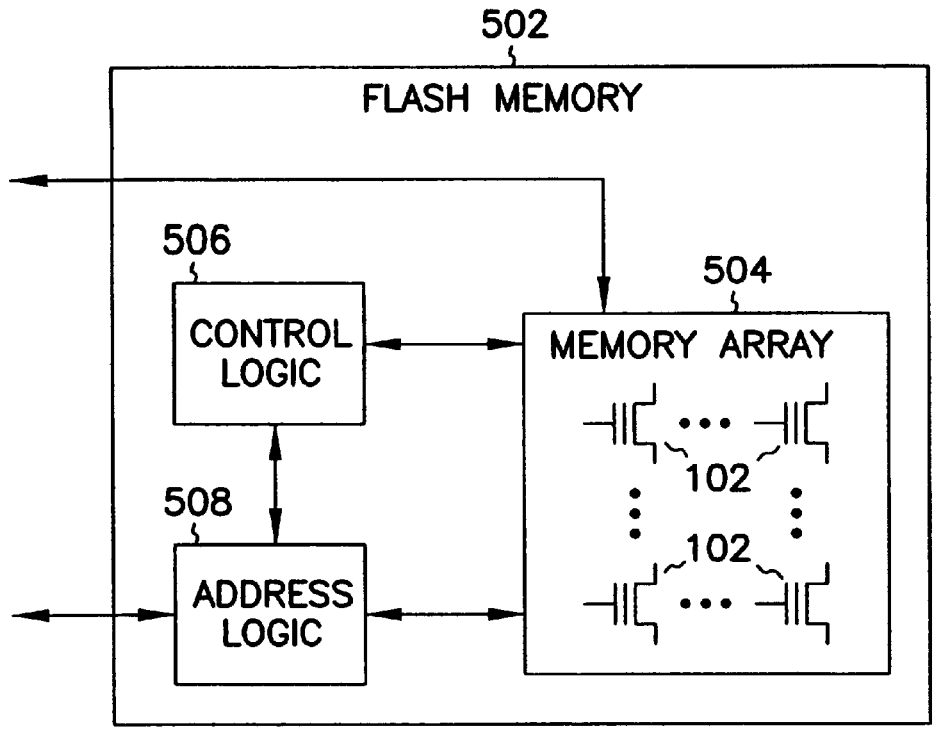
FIG. 5 illustrates one embodiment of a flash memory.
Figure 6:
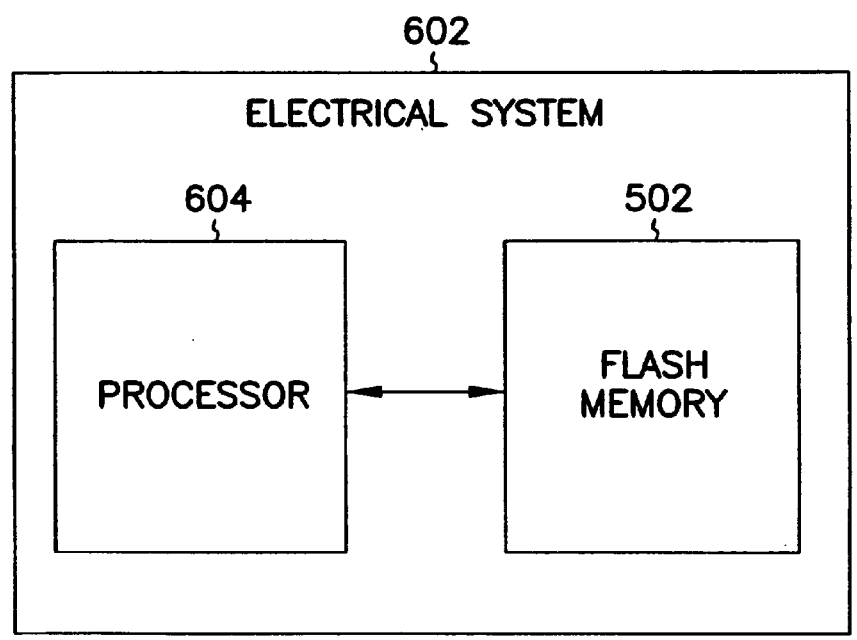
FIG. 6 illustrates one embodiment of an electrical system.

Pulsed programming may be used to program flash cells 102 in a flash memory. The flash cells 102 may be incorporated into a memory array of the flash memory. One embodiment of the flash memory 502, illustrated in FIG. 5, includes control logic 506 and address logic 508 coupled to one another and a memory array 504 having flash cells 102.

The flash memory 502 may be coupled to a processor 604 to form an electrical system 602. The processor 504 may be a microprocessor, such as an Intel Corporation Pentium processor, or a digital signal processor. The electrical system 602 may be a computer, a communication system, an audio or video system, a combination thereof, or other such electrical systems. For example, the video system may be a digital still or video camera.

Conclusion

The present invention provides a method and apparatus for reducing programming time and current in a flash memory. It is an advantage of the present invention that flash cell current consumption is increased. It is a further benefit that flash cell programming time is reduced.

It is understood that the above description is intended to be illustrative, and not restrictive. Many embodiments will be apparent to those skilled in the art upon reviewing the above description.

What is claimed is:

1. A flash cell comprising:
   a control gate;
   a channel between a drain and a source;
   a floating gate between the control gate and the channel;
   a drain supply circuit to apply a drain pulse to the drain of the flash cell;
   a gate supply circuit to apply a gate pulse to the control gate of the flash cell when the drain pulse is applied and to modulate an amplitude of the gate pulse between a maximum amplitude and a diminished amplitude to apply a series of modulated gate pulses to the control gate to program the flash cell.

2. The flash cell of claim 1 wherein the drain supply circuit comprises a charge pump circuit.

3. The flash cell of claim 1 wherein the gate supply circuit comprises a switchable charge pump circuit.

4. The flash cell of claim 3 wherein the switchable charge pump circuit comprises a charge pump circuit coupled to a switch.

5. The flash cell of claim 1 wherein the drain supply circuit further comprises a circuit to apply a voltage to the drain that is decreasing in amplitude when the modulated gate pulses are applied to the control gate.

6. The flash cell of claim 1 wherein:
   the drain supply circuit comprises a charge pump circuit to apply a drain pulse to the drain of the flash cell, the drain pulse having a width of approximately 10 microseconds, a minimum amplitude of approximately zero volts, and a peak amplitude that decays from approximately five and one-half volts to approximately five volts;
   the gate supply circuit comprises a charge pump circuit coupled to a switch to apply a gate pulse to the control gate of the flash cell, the gate pulse having a width of approximately 30 microseconds and a minimum amplitude of zero volts, and to modulate a peak amplitude of the gate pulse between eleven volts and seven volts to apply a series of modulated gate pulses having a width of approximately 333 nanoseconds and a duty cycle of 50 percent to the control gate.

7. A flash memory comprising:
   control logic;
   address logic; and
   an array of flash cells coupled to the control logic and the address logic, each flash cell comprising:
      a control gate;
      a channel between a drain and a source;
      a floating gate between the control gate and the channel;
      a drain supply circuit to apply a drain pulse to the drain of the flash cell;
      a gate supply circuit to apply a gate pulse to the control gate of the flash cell when the drain pulse is applied and to modulate an amplitude of the gate pulse between a maximum amplitude and a diminished amplitude to apply a series of modulated gate pulses to the control gate to program the flash cell.

8. The flash memory of claim 7 wherein the drain supply circuit comprises a charge pump circuit.

9. The flash memory of claim 7 wherein the gate supply circuit comprises a switchable charge pump circuit.

10. The flash memory of claim 9 wherein the switchable charge pump circuit comprises a charge pump circuit coupled to a switch.

11. The flash memory of claim 7 wherein the drain supply circuit further comprises a circuit to apply a voltage to the drain that is decreasing in amplitude when the modulated gate pulses are applied to the control gate.

12. The flash memory of claim 7 wherein:
   the drain supply circuit comprises a charge pump circuit to apply a drain pulse to the drain of the flash cell, the drain pulse having a width of approximately 10 microseconds, a minimum amplitude of approximately zero volts, and a peak amplitude that decays from approximately five and one-half volts to approximately five volts;
   the gate supply circuit comprises a charge pump circuit coupled to a switch to apply a gate pulse to the control gate of the flash cell, the gate pulse having a width of approximately 30 microseconds and a minimum amplitude of zero volts, and to modulate a peak amplitude of the gate pulse between eleven volts and seven volts to apply a series of modulated gate pulses having a width of approximately 333 nanoseconds and a duty cycle of 50 percent to the control gate.

13. A method of operating a flash cell comprising:
applying a drain pulse to a drain of a flash cell;
applying a gate pulse to a control gate of the flash cell when applying the drain pulse; and
modulating an amplitude of the gate pulse between a maximum amplitude and a diminished amplitude to apply a series of modulated gate pulses to the control gate to program the flash cell.

14. The method of claim 13 wherein applying a drain pulse further comprises applying a voltage to the drain that is decreasing in amplitude when applying the modulated gate pulses to the control gate.

15. The method of claim 13 wherein modulating further comprises modulating the amplitude of the gate pulse alternately between the maximum amplitude and the diminished amplitude to operate the flash cell alternately in linear and saturated regions.

16. The method of claim 13 wherein modulating further comprises modulating the amplitude of the gate pulse alternately between the diminished amplitude to increase a generation of hot electrons in a channel of the flash cell and the maximum amplitude to draw the hot electrons into a floating gate of the flash cell from the channel.

17. The method of claim 13 wherein:
applying a drain pulse comprises applying a drain pulse to a drain of a flash cell from a charge pump, the drain pulse having a width of approximately 10 microseconds, a minimum amplitude of approximately zero volts, and a peak amplitude that decays from approximately five and one-half volts to approximately five volts;
applying a gate pulse comprises applying a gate pulse to a control gate of the flash cell from a charge pump coupled to a switch, the gate pulse having a width of approximately 30 microseconds, a minimum amplitude of zero volts, and a peak amplitude; and
modulating comprises modulating the peak amplitude of the gate pulse between eleven volts and seven volts to apply a series of modulated gate pulses having a width of approximately 333 nanoseconds and a duty cycle of 50 percent to the control gate.

18. A method of operating a flash memory comprising:
exchanging signals between control logic, address logic, and an array of flash cells in the flash memory; and
programming a flash cell in the array comprising:
applying a drain pulse to a drain of the flash cell;
applying a gate pulse to a control gate of the flash cell when applying the drain pulse; and
modulating an amplitude of the gate pulse between a maximum amplitude and a diminished amplitude to apply a series of modulated gate pulses to the control gate to program the flash cell.

19. The method of claim 18 wherein applying a drain pulse further comprises applying a voltage to the drain that is decreasing in amplitude when applying the modulated gate pulses to the control gate.

20. The method of claim 18 wherein modulating further comprises modulating the amplitude of the gate pulse alternately between the maximum amplitude and the diminished amplitude to operate the flash cell alternately in linear and saturated regions.

21. The method of claim 18 wherein modulating further comprises modulating the amplitude of the gate pulse alternately between the diminished amplitude to increase a generation of hot electrons in a channel of the flash cell and the maximum amplitude to draw the hot electrons into a floating gate of the flash cell from the channel.

22. The method of claim 18 wherein:
applying a drain pulse comprises applying a drain pulse to a drain of the flash cell from a charge pump, the drain pulse having a width of approximately 10 microseconds, a minimum amplitude of approximately zero volts, and a peak amplitude that decays from approximately five and one-half volts to approximately five volts;
applying a gate pulse comprises applying a gate pulse to a control gate of the flash cell from a charge pump coupled to a switch, the gate pulse having a width of approximately 30 microseconds, a minimum amplitude of zero volts, and a peak amplitude; and
modulating comprises modulating the peak amplitude of the gate pulse between eleven volts and seven volts to apply a series of modulated gate pulses having a width of approximately 333 nanoseconds and a duty cycle of 50 percent to the control gate.

23. A method of operating an electrical system comprising:
exchanging signals between a processor and a flash memory;
exchanging signals between control logic, address logic, and an array of flash cells in the flash memory; and
programming a flash cell in the array comprising:
applying a drain pulse to a drain of the flash cell;
applying a gate pulse to a control gate of the flash cell when applying the drain pulse; and
modulating an amplitude of the gate pulse between a maximum amplitude and a diminished amplitude to apply a series of modulated gate pulses to the control gate to program the flash cell.

24. The method of claim 23 wherein applying a drain pulse further comprises applying a voltage to the drain that is decreasing in amplitude when applying the modulated gate pulses to the control gate.

25. The method of claim 23 wherein modulating further comprises modulating the amplitude of the gate pulse alternately between the maximum amplitude and the diminished amplitude to operate the flash cell alternately in linear and saturated regions.

26. The method of claim 23 wherein modulating further comprises modulating the amplitude of the gate pulse alternately between the diminished amplitude to increase a generation of hot electrons in a channel of the flash cell and the maximum amplitude to draw the hot electrons into a floating gate of the flash cell from the channel.

27. The method of claim 23 wherein:
applying a drain pulse comprises applying a drain pulse to a drain of the flash cell from a charge pump, the drain pulse having a width of approximately 10 microseconds, a minimum amplitude of approximately zero volts, and a peak amplitude that decays from approximately five and one-half volts to approximately five volts;
applying a gate pulse comprises applying a gate pulse to a control gate of the flash cell from a charge pump coupled to a switch, the gate pulse having a width of approximately 30 microseconds, a minimum amplitude of zero volts, and a peak amplitude; and
modulating comprises modulating the peak amplitude of the gate pulse between eleven volts and seven volts to apply a series of modulated gate pulses having a width of approximately 333 nanoseconds and a duty cycle of 50 percent to the control gate.

28. A method of operating a flash cell comprising:

applying a drain voltage to a drain of a flash cell;

applying a gate pulse having a maximum amplitude and a minimum amplitude to a control gate of the flash cell to program the flash cell; and modulating the gate pulse between the maximum amplitude and a diminished amplitude, the diminished amplitude being between the maximum amplitude and the minimum amplitude.

29. The method of claim 28 wherein applying a drain voltage further comprises applying a drain voltage to the drain that is decreasing in amplitude when applying the gate pulse to the control gate of the flash cell.

30. The method of claim 28 wherein:

applying a drain voltage comprises applying a drain pulse to a drain of a flash cell from a charge pump, the drain pulse having a width of approximately 10 microseconds, a minimum amplitude of approximately zero volts, and a peak amplitude that decays from approximately five and one-half volts to approximately five volts;

applying a gate pulse comprises applying a gate pulse to a control gate of the flash cell from a charge pump coupled to a switch to program the flash cell, the gate pulse having a width of approximately 30 microseconds, a maximum amplitude, and a minimum amplitude of approximately zero volts; and modulating comprises modulating the gate pulse alternately between the maximum amplitude of approximately eleven volts and a diminished amplitude of approximately seven volts to apply a series of modulated gate pulses to the control gate having a width of approximately 333 nanoseconds and a duty cycle of approximately fifty percent to operate the flash cell alternately in linear and saturated regions.

31. A method of operating a flash memory comprising:

exchanging signals between control logic, address logic, and an array of flash cells in the flash memory; and programming a flash cell in the array comprising:

applying a drain voltage to a drain of a flash cell;

applying a gate pulse having a maximum amplitude and a minimum amplitude to a control gate of the flash cell to program the flash cell; and modulating the gate pulse between the maximum amplitude and a diminished amplitude, the diminished amplitude being between the maximum amplitude and the minimum amplitude.

32. The method of claim 31 wherein applying a drain voltage further comprises applying a drain voltage to the drain that is decreasing in amplitude when applying the gate pulse to the control gate of the flash cell.

33. The method of claim 31 wherein:

applying a drain voltage comprises applying a drain pulse to a drain of a flash cell from a charge pump, the drain pulse having a width of approximately 10 microseconds, a minimum amplitude of approximately zero volts, and a peak amplitude that decays from approximately five and one-half volts to approximately five volts;

applying a gate pulse comprises applying a gate pulse to a control gate of the flash cell from a charge pump coupled to a switch to program the flash cell, the gate pulse having a width of approximately 30 microseconds, a maximum amplitude, and a minimum amplitude of approximately zero volts; and modulating comprises modulating the gate pulse alternately between the maximum amplitude of approximately eleven volts and a diminished amplitude of approximately seven volts to apply a series of modulated gate pulses to the control gate having a width of approximately 333 nanoseconds and a duty cycle of approximately fifty percent to operate the flash cell alternately in linear and saturated regions.

34. A method of operating a system comprising:

exchanging signals between a processor and a flash memory;

exchanging signals between control logic, address logic, and an array of flash cells in the flash memory; and programming a flash cell in the array comprising:

applying a drain voltage to a drain of a flash cell;

applying a gate pulse having a maximum amplitude and a minimum amplitude to a control gate of the flash cell to program the flash cell; and modulating the gate pulse between the maximum amplitude and a diminished amplitude, the diminished amplitude being between the maximum amplitude and the minimum amplitude.

35. The method of claim 34 wherein applying a drain voltage further comprises applying a drain voltage to the drain that is decreasing in amplitude when applying the gate pulse to the control gate of the flash cell.

36. The method of claim 34 wherein:

applying a drain voltage comprises applying a drain pulse to a drain of a flash cell from a charge pump, the drain pulse having a width of approximately 10 microseconds, a minimum amplitude of approximately zero volts, and a peak amplitude that decays from approximately five and one-half volts to approximately five volts;

applying a gate pulse comprises applying a gate pulse to a control gate of the flash cell from a charge pump coupled to a switch to program the flash cell, the gate pulse having a width of approximately 30 microseconds, a maximum amplitude, and a minimum amplitude of approximately zero volts; and modulating comprises modulating the gate pulse alternately between the maximum amplitude of approximately eleven volts and a diminished amplitude of approximately seven volts to apply a series of modulated gate pulses to the control gate having a width of approximately 333 nanoseconds and a duty cycle of approximately fifty percent to operate the flash cell alternately in linear and saturated regions.

37. An electrical system comprising:

a processor; and a flash memory coupled to the processor, the flash memory comprising:

control logic;

address logic; and an array of flash cells coupled to the control logic and the address logic, each flash cell comprising:

a control gate;

a channel between a drain and a source;

a floating gate between the control gate and the channel;

a drain supply circuit to apply a drain pulse to the drain of the flash cell;

a gate supply circuit to apply a gate pulse to the control gate of the flash cell when the drain pulse is applied and to modulate an amplitude of the gate pulse between a maximum amplitude and a diminished amplitude to apply a series of modulated gate pulses to the control gate to program the flash cell.

38. The electrical system of claim 37 wherein the drain supply circuit comprises a charge pump circuit.

39. The electrical system of claim 37 wherein the gate supply circuit comprises a switchable charge pump circuit.

40. The electrical system of claim 39 wherein the switchable charge pump circuit comprises a charge pump circuit coupled to a switch.

41. The electrical system of claim 37 wherein the drain supply circuit further comprises a circuit to apply a voltage to the drain that is decreasing in amplitude when the modulated gate pulses are applied to the control gate.

42. The electrical system of claim 37 wherein:
the drain supply circuit comprises a charge pump circuit to apply a drain pulse to the drain of the flash cell, the drain pulse having a width of approximately 10 microseconds, a minimum amplitude of approximately zero volts, and a peak amplitude that decays from approximately five and one-half volts to approximately five volts;
the gate supply circuit comprises a charge pump circuit coupled to a switch to apply a gate pulse to the control gate of the flash cell, the gate pulse having a width of approximately 30 microseconds and a minimum amplitude of zero volts, and to modulate a peak amplitude of the gate pulse between eleven volts and seven volts to apply a series of modulated gate pulses having a width of approximately 333 nanoseconds and a duty cycle of 50 percent to the control gate.

43. A flash cell comprising:
a control gate;
a channel between a drain and a source;
a floating gate between the control gate and the channel;
a drain supply circuit to apply a drain voltage to the drain of the flash cell;
a gate supply circuit to apply a gate pulse having a maximum amplitude and a minimum amplitude to the control gate of the flash cell to program the flash cell and to modulate the gate pulse between the maximum amplitude and a diminished amplitude, the diminished amplitude being between the maximum amplitude and the minimum amplitude.

44. The flash cell of claim 43 wherein the drain supply circuit comprises a drain supply circuit to apply a drain voltage to the drain of the flash cell that is decreasing in amplitude when the gate pulse is applied to the control gate.

45. The flash cell of claim 43 wherein:
the drain supply circuit comprises a charge pump circuit to apply a drain pulse to the drain of the flash cell, the drain pulse having a width of approximately 10 microseconds, a minimum amplitude of approximately zero volts, and a peak amplitude that decays from approximately five and one-half volts to approximately five volts;
the gate supply circuit comprises a charge pump circuit coupled to a switch to apply a gate pulse to the control gate of the flash cell to program the flash cell, the gate pulse having a width of approximately 30 microseconds and a minimum amplitude of approximately zero volts, and to modulate the gate pulse alternately between a maximum amplitude of approximately eleven volts and a diminished amplitude of approximately seven volts to apply a series of modulated gate pulses to the control gate having a width of approximately 333 nanoseconds and a duty cycle of approximately fifty percent to operate the flash cell alternately in linear and saturated regions.

46. A flash memory comprising:
control logic;
address logic; and
an array of flash cells coupled to the control logic and the address logic, each flash cell comprising:
a control gate;
a channel between a drain and a source;
a floating gate between the control gate and the channel;
a drain supply circuit to apply a drain voltage to the drain of the flash cell;
a gate supply circuit to apply a gate pulse having a maximum amplitude and a minimum amplitude to the control gate of the flash cell to program the flash cell and to modulate the gate pulse between the maximum amplitude and a diminished amplitude, the diminished amplitude being between the maximum amplitude and the minimum amplitude.

47. The flash memory of claim 46 wherein the drain supply circuit comprises a drain supply circuit to apply a drain voltage to the drain of the flash cell that is decreasing in amplitude when the gate pulse is applied to the control gate.

48. The flash memory of claim 46 wherein:
the drain supply circuit comprises a charge pump circuit to apply a drain pulse to the drain of the flash cell, the drain pulse having a width of approximately 10 microseconds, a minimum amplitude of approximately zero volts, and a peak amplitude that decays from approximately five and one-half volts to approximately five volts;
the gate supply circuit comprises a charge pump circuit coupled to a switch to apply a gate pulse to the control gate of the flash cell to program the flash cell, the gate pulse having a width of approximately 30 microseconds and a minimum amplitude of approximately zero volts, and to modulate the gate pulse alternately between a maximum amplitude of approximately eleven volts and a diminished amplitude of approximately seven volts to apply a series of modulated gate pulses to the control gate having a width of approximately 333 nanoseconds and a duty cycle of approximately fifty percent to operate the flash cell alternately in linear and saturated regions.

49. An electrical system comprising:
a processor; and
a flash memory coupled to the processor, the flash memory comprising:
control logic;
address logic; and
an array of flash cells coupled to the control logic and the address logic, each flash cell comprising:
a control gate;
a channel between a drain and a source;
a floating gate between the control gate and the channel;
a drain supply circuit to apply a drain voltage to the drain of the flash cell;
a gate supply circuit to apply a gate pulse having a maximum amplitude and a minimum amplitude to the control gate of the flash cell to program the flash cell and to modulate the gate pulse between the maximum amplitude and a diminished amplitude, the diminished amplitude being between the maximum amplitude and the minimum amplitude.

50. The flash memory of claim 49 wherein the drain supply circuit comprises a drain supply circuit to apply a drain voltage to the drain of the flash cell that is decreasing in amplitude when the gate pulse is applied to the control gate.

51. The flash memory of claim 49 wherein:

the drain supply circuit comprises a charge pump circuit to apply a drain pulse to the drain of the flash cell, the drain pulse having a width of approximately 10 microseconds, a minimum amplitude of approximately zero volts, and a peak amplitude that decays from approximately five and one-half volts to approximately five volts;

the gate supply circuit comprises a charge pump circuit coupled to a switch to apply a gate pulse to the control gate of the flash cell to program the flash cell, the gate pulse having a width of approximately 30 microseconds and a minimum amplitude of approximately zero volts, and to modulate the gate pulse alternately between a maximum amplitude of approximately eleven volts and a diminished amplitude of approximately seven volts to apply a series of modulated gate pulses to the control gate having a width of approximately 333 nanoseconds and a duty cycle of approximately fifty percent to operate the flash cell alternately in linear and saturated regions.

* * * * *

UNITED STATES PATENT AND TRADEMARK OFFICE
CERTIFICATE OF CORRECTION

PATENT NO.    : 6,088,266
DATED         : Jul. 11, 2000
INVENTOR(S)   : Roohparvar It is certified that error appears in the above-identified patent and that said Letters Patent is hereby corrected as shown below:

Delete the title in its entirety and insert, therefor,

--Programming Pulse with Varying Amplitude --.

Signed and Sealed this

Twelfth Day of June, 2001

*Attest:*

*Attesting Officer*

NICHOLAS P. GODICI
*Acting Director of the United States Patent and Trademark Office*